United States Patent
Chu

(10) Patent No.: US 11,935,582 B2
(45) Date of Patent: Mar. 19, 2024

(54) METHOD FOR SENSE MARGIN DETECTION FOR SENSE AMPLIFIER AND ELECTRONIC DEVICE

(71) Applicant: CHANGXIN MEMORY TECHNOLOGIES, INC., Hefei (CN)

(72) Inventor: Xikun Chu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 127 days.

(21) Appl. No.: 17/868,774

(22) Filed: Jul. 20, 2022

(65) Prior Publication Data
US 2023/0386560 A1    Nov. 30, 2023

(30) Foreign Application Priority Data
May 25, 2022 (CN) .......................... 202210580413.6

(51) Int. Cl.
  *G11C 11/40*    (2006.01)
  *G11C 11/408*   (2006.01)
  *G11C 11/4091*  (2006.01)
  *G11C 11/4094*  (2006.01)
  *G11C 11/4096*  (2006.01)
(52) U.S. Cl.
  CPC ...... *G11C 11/4091* (2013.01); *G11C 11/4085* (2013.01); *G11C 11/4094* (2013.01); *G11C 11/4096* (2013.01)

(58) Field of Classification Search
  None
  See application file for complete search history.

(56) References Cited

U.S. PATENT DOCUMENTS

| 6,230,292 B1 | 5/2001 | Duesman et al. |
| 10,909,032 B2* | 2/2021 | Yoon ...................... G11C 5/025 |
| 2008/0056032 A1* | 3/2008 | Tomita ................... G11C 29/02 365/201 |

* cited by examiner

*Primary Examiner* — Tan T. Nguyen
(74) *Attorney, Agent, or Firm* — Kilpatrick Townsend & Stockton LLP

(57) ABSTRACT

Embodiments provide a method for sense margin detection for a sense amplifier and an electronic device. The method includes: writing first data and second data respectively to a first memory cell and a second memory cell connected to a first bit line, the first memory cell and the second memory cell being respectively connected to a first word line and a second word line adjacent to each other, and the first bit line being connected to a first sense amplifier; performing a reverse write operation on the first memory cell and the second memory cell; performing write operations on memory cells connected to the second bit line; and reading the second memory cell, and determining the preset row precharge time to be a margin value of row precharge time of the first sense amplifier when the first data is not correctly read.

15 Claims, 10 Drawing Sheets

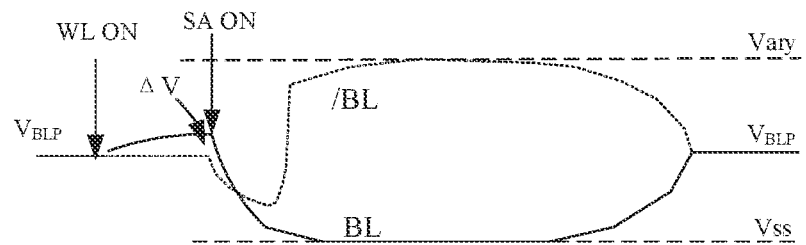

| Write first data and second data respectively to a first memory cell and a second memory cell connected to a first bit line, the first memory cell and the second memory cell are respectively connected to a first word line and a second word line adjacent to each other, and the first bit line is connected to a first sense amplifier | — S1 |

↓

| Perform a reverse write operation on the first memory cell and the second memory cell, the reverse write operation includes reversely writing the second data to the first memory cell and reversely writing the first data to the second memory cell | — S2 |

↓

| Perform write operations on memory cells connected to the second bit line, the first word line and the second word line, there is preset row precharge time between adjacent two of the write operations, the second bit line is connected to a second sense amplifier, both the second sense amplifier and the first sense amplifier are positioned in a same sense amplifier array | — S3 |

↓

| Read the second memory cell, and determine the preset row precharge time to be a margin value of row precharge time of the first sense amplifier when the first data is not correctly read | — S4 |

METHOD FOR SENSE MARGIN DETECTION FOR SENSE AMPLIFIER AND ELECTRONIC DEVICE

CROSS-REFERENCE TO RELATED APPLICATION

This application claims priority to Chinese Patent Application No. 202210580413.6, titled "METHOD FOR SENSE MARGIN DETECTION FOR SENSE AMPLIFIER AND ELECTRONIC DEVICE" and filed to the State Patent Intellectual Property Office on May 25, 2022, the entire contents of which are incorporated herein by reference.

TECHNICAL FIELD

The present disclosure relates to the field of integrated circuit detection technology, and more particularly, to a method for sense margin detection for a sense amplifier and an electronic device.

BACKGROUND

A sense amplifier (SA) is a differential amplifier, its two input terminals are respectively connected to a bit line BL and a complementary bit line /BL, to amplify a weak voltage difference between the bit line BL and the complementary bit line /BL. As an important circuit in a memory, a detection ability (i.e., sense margin) of the sense amplifier to amplify the weak voltage difference is an important indicator of the memory. Therefore, it is required a method that can accurately detect sensing ability of the sense amplifier.

It is to be noted that the information disclosed in the above background art section is only for enhancement of understanding of the background of the present disclosure, and therefore may include information that does not constitute the prior art that is already known to a person of ordinary skill in the art.

SUMMARY

An objective of the present disclosure is to provide a method for sense margin detection for a sense amplifier and an electronic device, to improve accuracy of detecting sensing ability of the sense amplifier.

According to a first aspect of the present disclosure, there is provided a method for sense margin detection for a sense amplifier, The method includes: writing first data and second data respectively to a first memory cell and a second memory cell connected to a first bit line, the first memory cell and the second memory cell being respectively connected to a first word line and a second word line adjacent to each other, and the first bit line being connected to a first sense amplifier; performing a reverse write operation on the first memory cell and the second memory cell, the reverse write operation comprising reversely writing the second data to the first memory cell and reversely writing the first data to the second memory cell; performing write operations on memory cells connected to the second bit line, the first word line and the second word line, there being preset row precharge time between adjacent two of the write operations, the second bit line being connected to a second sense amplifier, both the second sense amplifier and the first sense amplifier being positioned in a same sense amplifier array; and reading the second memory cell, and determining the preset row precharge time to be a margin value of row precharge time of the first sense amplifier when the first data is not correctly read.

In an exemplary embodiment of the present disclosure, there are a plurality of the first bit lines, and the second bit line is a first bit line next to the first bit line in a current operation. The writing first data and second data respectively to a first memory cell and a second memory cell connected to a first bit line comprises: writing the first data and the second data respectively to the first memory cell and the second memory cell connected to a plurality of groups of first bit lines in a first order, where each of the plurality of groups of first bit lines includes a first number of first bit lines adjacent to each other, and the first order is determined according to sequence numbers of bit lines in the plurality of groups of first bit lines from small to large. The performing write operations on memory cells connected to the second bit line, the first word line and the second word line comprises: performing the reverse write operation on the first memory cell and the second memory cell connected to the second bit line, where the second bit line is one of the plurality of first bit lines.

In an exemplary embodiment of the present disclosure, before reading the second memory cell, the detection method further comprises: performing the reverse write operation on the first memory cell and the second memory cell connected to the plurality of groups of first bit lines in a second order, where the second order is opposite to the first order.

In an exemplary embodiment of the present disclosure, the method further includes: reducing the preset row precharge time for detection again when the first data is correctly read from each of the second memory cells.

In an exemplary embodiment of the present disclosure, in the reverse write operation, write time of the first data is controlled to be preset write delay, such that insufficient write of the first data occurs in the second memory cell.

In an exemplary embodiment of the present disclosure, the first data is 1 and the second data is 0; or the first data is 0 and the second data is 1.

In an exemplary embodiment of the present disclosure, the first number is equal to a burst length of a memory array to be tested, where the memory array to be tested is a memory array where the first memory cell and the second memory cell are positioned.

In an exemplary embodiment of the present disclosure, the first memory cell and the second memory cell comprise all memory cells connected to bit lines corresponding to all sense amplifiers to be tested.

In an exemplary embodiment of the present disclosure, each of the memory cells adjacent to the first memory cell on the same first bit line is the second memory cell.

In an exemplary embodiment of the present disclosure, the first memory cell and the second memory cell are arranged on the same word line.

In an exemplary embodiment of the present disclosure, on the same first bit line, one or more of the first memory cells are adjacent to each other, one or more of the second memory cells are adjacent to each other, and at least one of the second memory cells is adjacent to the first memory cells.

In an exemplary embodiment of the present disclosure, the first sense amplifier is connected to a test voltage.

In an exemplary embodiment of the present disclosure, when the first data is 1, a power supply voltage of the test voltage is lower than a power supply voltage when the memory array to be tested is working properly; and when the first data is 0, a grounding voltage of the test voltage is higher than a grounding voltage of the memory array to be tested.

According to a second aspect of the present disclosure, there is provided an electronic device, which includes: a memory, and a processor coupled to the memory. The processor is configured to perform the method according to any one of the above embodiments based on instructions stored in the memory.

According to a third aspect of the present disclosure, there is provided a computer-readable storage medium having a program stored thereon, the program is executable by a processor, whereby the method according to any one of the above embodiments is implemented.

In the embodiments of the present disclosure, by are writing different data to the first memory cell and the second memory cell respectively connected to the first word line and the second word line and connected to the first bit line of the first sense amplifier, by performing write operations on memory cells connected to the second bit line having an effect on operation of the first bit line, to the first word line and the second word line, and by reducing row precharge time between the write operations, the row precharge time corresponding to the first memory cell may be reduced when the first bit line and the second bit line work in parallel, such that data impact of the first memory cell is remained on the first bit line, sense margin of the first sense amplifier to the second sense amplifier when the first bit line works in parallel is reduced, and probability of the first sense amplifier failing to sense the second memory cell is increased. Therefore, the margin value of row precharge time can be more quickly detected for the first sense amplifier, and a higher detection efficiency is provided.

It is to be understood that the above general description and the detailed description below are merely exemplary and explanatory, and do not limit the present disclosure.

BRIEF DESCRIPTION OF THE DRAWINGS

FIG. 4B is a schematic diagram of failure to read data "1" in a scenario corresponding to FIG. 3B;

FIG. 5 is a flowchart of a method for sense margin detection for a sense amplifier in an embodiment of the present disclosure;

FIG. 10 is a schematic diagram showing a test process for testing the entire memory array according to an embodiment of the present disclosure.

DETAILED DESCRIPTION

Figure 1:
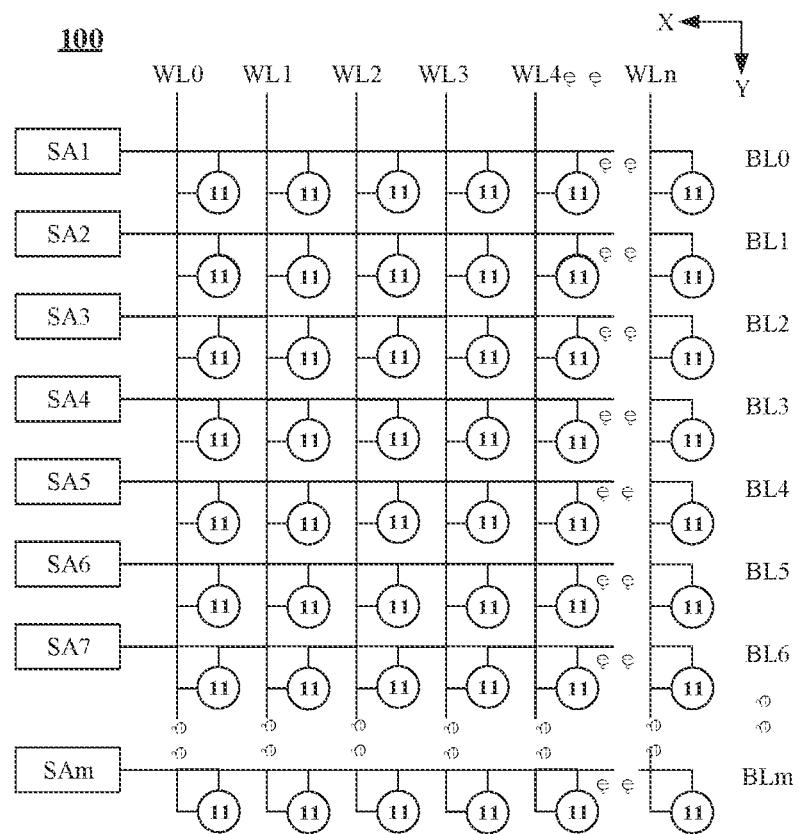
FIG. 1 is a schematic diagram of a memory array to be tested in an exemplary embodiment of the present disclosure.

Exemplary embodiments will now be described more comprehensively with reference to the accompanying drawings. However, the exemplary embodiments can be embodied in many forms and should not be construed as being limited to the embodiments set forth herein; rather, these embodiments are provided such that the present disclosure will be more thorough and complete, and the concept of the exemplary embodiments will be fully conveyed to those skilled in the art. Furthermore, the described features, structures, or characteristics may be combined in any suitable manner in one or more embodiments. In the following description, numerous details are provided to provide a thorough understanding of the embodiments of the present disclosure. Those skilled in the art will recognize, however, that the technical solution of the present disclosure may be practiced without one or more of the details described, or that other methods, components, devices, steps and so on may be employed. In other instances, well-known technical solutions are not shown or described in detail to avoid obscuring aspects of the present disclosure.

Furthermore, the accompanying drawings are merely schematic illustrations of the present disclosure. Same or similar parts are denoted by same reference numbers in the drawings and, thus, a detailed description thereof will be omitted. Some block diagrams shown in the figures are functional entities and not necessarily to be corresponding to a physically or logically individual entities. These functional entities may be implemented in software form, or implemented in one or more hardware circuits or integrated circuits, or implemented in different networks and/or processor apparatuses and/or microcontroller apparatuses.

A detailed description of the exemplary embodiments of the present disclosure will be made in the following with reference to the accompanying drawings.

FIG. 1 is a schematic diagram of a memory array to be tested in an exemplary embodiment of the present disclosure.

Referring to FIG. 1, a memory array 100 may include m bit lines BL1 to BLm, n word lines WL1 to WLn, and m*n memory cells 11, where each of the memory cells 11 is connected to one word line WL* and one bit line BL* ("*" represents any numeral). One word line WL* is connected to m memory cells 11, and one bit line BL* is connected to n memory cells 11. The m bit lines BL1 to BLm extend in an X direction and are arranged in a Y direction; and the n word lines WL1 to WLn extend in the Y direction and are arranged in the X direction. Both the m and the n are positive integers greater than or equal to 2.

Each bit line BL* is connected to one sense amplifier SA*, and the sense amplifier SA* is also connected to a local data line LIO* (not shown) to transfer data on the local data line LIO* to the bit line BL*, or to read the data on the bit line BL* onto the local data line LIO*.

Figure 2:
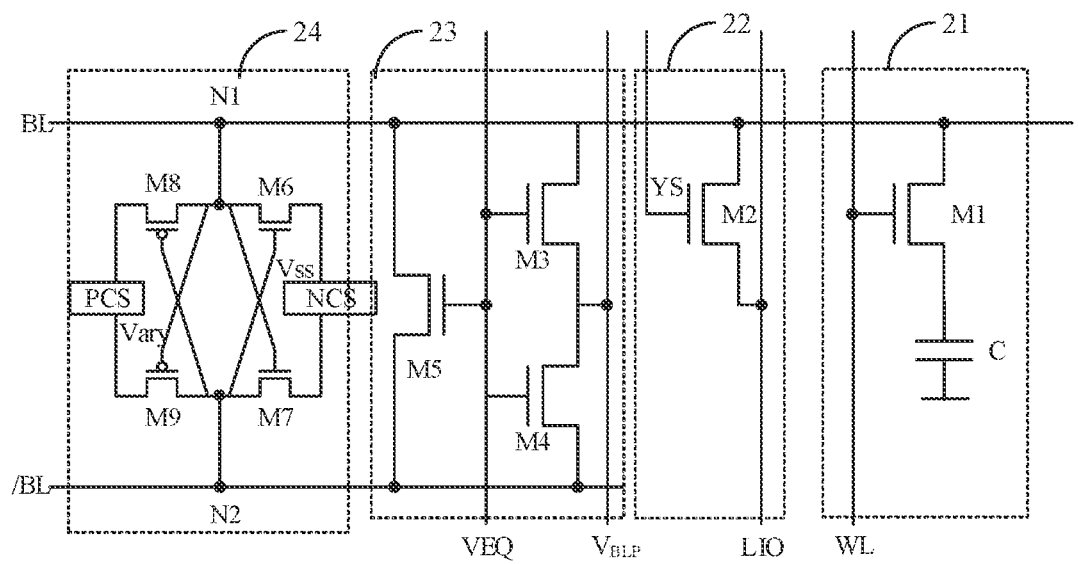
FIG. 2 is a schematic diagram showing a circuit structure of a bit line connection circuit in an embodiment of the present disclosure.

FIG. 2 is a schematic diagram showing a circuit structure of a sense amplifier in an embodiment of the present disclosure.

Referring to FIG. 2, a memory cell 21 includes a first transistor M1 and a memory capacitor C, where the first transistor M1 may be, for example, an N-type transistor. A source of the first transistor M1 is connected to the memory capacitor C, a drain of the first transistor M1 is connected to the bit line BL, and a gate of the first transistor M1 is connected to the word line WL. A column selection subcircuit 22, an equalization subcircuit 23 and a sense amplifier 24 are sequentially arranged on the bit line BL.

The column selection subcircuit 22 includes a second transistor M2, which is an N-type transistor. A source of the second transistor M2 is connected to a local input/output signal line LIO (Local Input/Output), a drain of the second transistor M2 is connected to the bit line BL, and a gate of the second transistor M2 is connected to a Y Select (YS) signal line, or called a Column Select (CSL) signal line. The Y Select signal line YS is configured to control to transmit the data on the bit line BL to the local input/output signal line LIO to complete data reading, or to transmit the data on the local input/output signal line LIO to the bit line BL to complete data writing.

The equalization subcircuit 23 includes a third transistor M3, a fourth transistor M4, and a fifth transistor M5. The third transistor M3, the fourth transistor M4 and the fifth transistor M5 are all N-type transistors. A gate of the third transistor M3, a gate of the fourth transistor M4 and a gate of the fifth transistor M5 are all connected to a voltage of equalizer (VEQ). A source of the third transistor M3 and a drain of the fourth transistor M4 are both connected to voltage of bit line precharge $V_{BLP}$, a drain of the third transistor M3 is connected to the bit line BL, and a source of the fourth transistor M4 is connected to the complementary bit line /BL.

A sense amplifier (SA) 22 is a differential amplifier, its two input terminals are respectively connected to the bit line BL and the complementary bit line /BL, to amplify a voltage difference between the bit line BL and the complementary bit line /BL. The sense amplifier 24 includes a sixth transistor M6, a seventh transistor M7, an eighth transistor M8, and a ninth transistor M9. The sixth transistor M6 and the seventh transistor M7 are both N-type transistors, and the eighth transistor M8 and the ninth transistor M9 are both P-type transistors. One terminal of the sixth transistor M6 is connected to the bit line BL through a first node N1, other terminal of the sixth transistor M6 is connected to a low voltage node NCS connected to a second voltage $V_{SS}$, and a control terminal of the sixth transistor M6 is connected to the complementary bit line /BL. One terminal of the seventh transistor M7 is connected to the complementary bit line /BL through a second node N2, other terminal of the seventh transistor M7 is connected to the low voltage node NCS, and a control terminal of the seventh transistor M7 is connected to the bit line BL. One terminal of the eighth transistor M8 is connected to the bit line BL through the first node N1, other terminal of the eighth transistor M8 is connected to a high voltage node PCS connected to a second voltage Vary, and a control terminal of the eighth transistor M8 is connected to the complementary bit line /BL. One terminal of the ninth transistor M9 is connected to the complementary bit line /BL through the second node N2, other terminal of the ninth transistor M9 is connected to the high voltage node PCS, and a control terminal of the ninth transistor M9 is connected to the bit line BL.

Figure 3A:
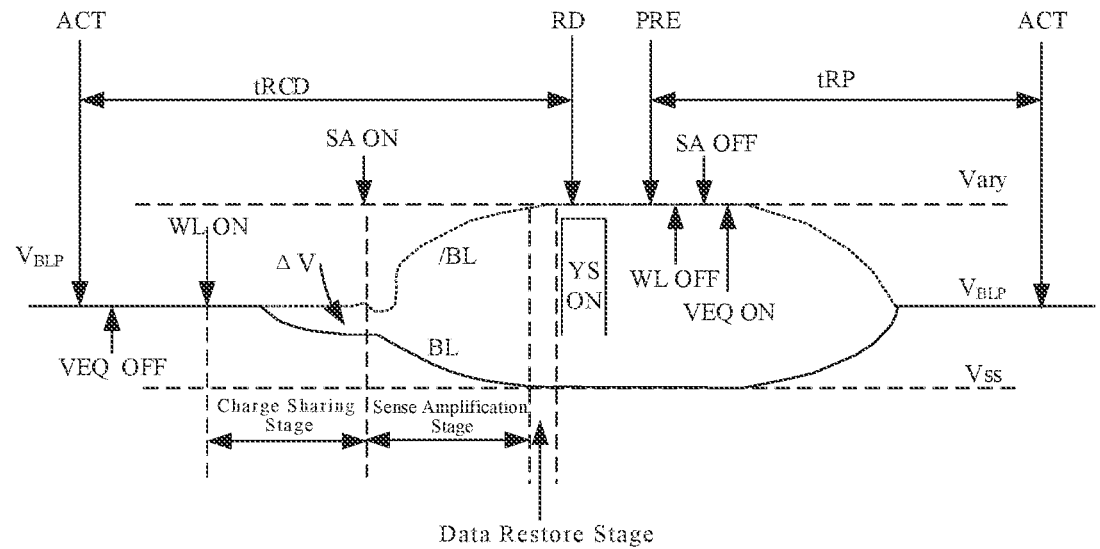
FIG. 3A and FIG. 3B are schematic diagrams of performing a memory cell read process by means of the circuit as shown in FIG. 2 in an embodiment of the present disclosure.
Figure 3B:
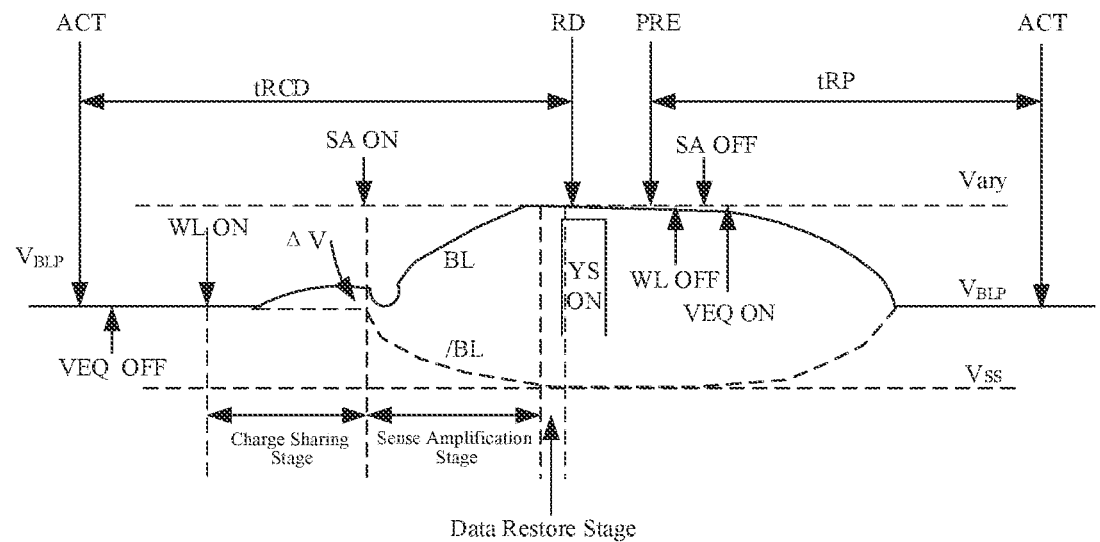

FIG. 3A and FIG. 3B are schematic diagrams of performing a process of reading a memory cell by means of the circuit as shown in FIG. 2 in an embodiment of the present disclosure.

Referring to FIG. 3A and FIG. 3B, before performing data reading, the voltage of equalizer VEQ turns on the three transistors M3, M4 and M5 in the equalization subcircuit 23, such that both the bit line BL and the complementary bit line /BL are equal to the voltage of bit line precharge $V_{BLP}$. After an activation signal ACT arrives, the voltage of equalizer VEQ is turned off (VEQ OFF), allowing presence of a voltage difference between the bit line BL and the complementary bit line /BL. Next, the word line WL is turned on (WL ON), reaching a logic "1", and the first transistor M1 in the memory cell 21 is turned on. The activation signal ACT is configured for controlling the sense amplifier 24 to enter a working state when a read operation and a write operation start.

In FIG. 3A, when data "0" is stored in the memory cell 21 at this moment, the memory capacitor C is at a low level, the bit line BL leaks electricity to the memory capacitor C through the first transistor M1, and thus a voltage on the bit line BL starts to drop from $V_{BLP}$. When the sense amplifier 24 is turned on (SA ON), if the voltage drop on the bit line BL enables the voltage difference $\Delta V$ between the bit line BL and the complementary bit line /BL to reach a level detectable by the sense amplifier 24, the sense amplifier 24 directly sets the bit line to the second voltage Vss and sets the complementary bit line to the first voltage Vary, to amplify voltage variation of the bit line. A process (that is, from the WL ON time point to the SA ON time point) in which the voltage on the bit line BL changes and has not been amplified is called a charge sharing process, and duration of the charge sharing process is called sensing delay time (SDT).

With continued reference to FIG. 2, a concrete amplification process of the sense amplifier 24 is as follows: when the voltage drop $\Delta V$ on the bit line BL drops to $V_{BLP}-\Delta V$, the voltage of the complementary bit line /BL is still $V_{BLP}$. Two input terminals of the sense amplifier 24 are respectively connected to the bit line BL and the $V_{BLP}$ bit line /BL. At this moment, the voltage $V_{BLP}$ of the control terminal of the sixth transistor M6 is greater than the voltage $V_{BLP}-\Delta V$ of the control terminal of the seventh transistor M7.

If $\Delta V$ is great enough and is greater than or equal to a threshold $\Delta V th$, a gate voltage of the ninth transistor M9 is lower, the ninth transistor M9 is quickly turned on, and the seventh transistor M7 is quickly turned off, such that the voltage of the second node N2 is quickly pulled to the first voltage Vary, the eighth transistor M8 controlled by the second node N2 is turned off, and the sixth transistor M6 is turned on. At this moment, the first node N1 is connected to the second voltage Vss through the sixth transistor M6 turned on. That is, the voltage of the bit line BL is equal to the second voltage $V_{SS}$, and the voltage of the complementary bit line /BL is equal to the first voltage Vary. At this point, the voltage difference $\Delta V$ caused by the electric leakage to the memory capacitor C by the bit line BL is amplified by the sense amplifier 24, the voltage of the bit line BL is equal to the second voltage $V_{SS}$, and the voltage of the complementary bit line /BL is equal to the first voltage Vary. The voltage difference $\Delta V th$ that enables the sense amplifier 24 to achieve a function of amplification is referred to as a sensing margin of the sense amplifier 24.

After the sense amplification process is completed, the bit line BL is at the stable second voltage $V_{SS}$. At this moment, the word line WL is not turned off, and the memory capacitor C may continue to leak electricity through the bit line BL. After a certain time, charges of the memory capacitor C may be restores to a state before the read operation. This stage is called a data restore stage.

After the data restore stage is ended, in response to a read control signal RD, a high-level pulse appears on the Y Select signal line YS, and the column selection subcircuit 22 is controlled to be turned on (YS ON) by means of a Y Select signal YS, and the voltage of the bit line BL is read onto the local input/output signal line LIO. When the voltage of the bit line BL is the first voltage Vary, a read result is "1"; and when the voltage of the bit line BL is the second voltage $V_{ss}$, the read result is "0". The period of time from the activation signal ACT to the read signal RD is tRCD. The tRCD represents delay time between row address strobe (RAS) to column address strobe (CAS), where the CAS and the RAS jointly determine memory addressing. In the tRCD time, there are three stages, namely, the charge sharing stage, the sense amplification stage, and the data restore stage.

After the Y Select signal YS is turned off (YS OFF), the sense amplifier 24 enters a preparatory stage for next reading in response to the precharge signal PRE, the word line WL is turned off (WL OFF), the sense amplifier 24 is turned off (SA OFF), and the voltage of equalizer VEQ is turned on (VEQ ON), such that the bit line BL and the complementary bit line /BL are both restored to a bit line equalization voltage $V_{BLP}$ until a next activation signal ACT is received, no matter the next activation signal ACT represents start of reading or start of writing.

The period of time from the precharge signal PRE to the next activation signal ACT is called row precharge time (tRP), which is configured for characterizing a speed at which a DRAM array restores to a precharge state, especially time required for the bit line in the array to charge from a high level or low level to the voltage of bit line precharge $V_{BLP}$. As can be seen from FIG. 3A, when the tRP time is shortened, recovery time of the bit line BL is insufficient, and thus affected by the appearance of the precharge signal PRE, the voltage of the bit line BL is higher or lower than the voltage of bit line precharge $V_{BLP}$.

In FIG. 3B, when the word line WL is turned on (WL ON), if data "1" is stored in the memory cell 21, the memory capacitor C is at a high level, the memory capacitor C leaks electricity to the bit line BL through the first transistor M1, and thus the voltage on the bit line BL starts to rise from $V_{BLP}$. When the sense amplifier 24 is turned on (SA ON), if the voltage rise on the bit line BL enables the voltage difference ΔV between the bit line BL and the complementary bit line /BL to reach a level detectable by the sense amplifier 24, the sense amplifier 24 directly sets the bit line to the first voltage Vary and sets the complementary bit line to the second voltage $V_{SS}$, to amplify voltage variation of the bit line.

In some embodiments, when the voltage of the bit line BL starts to rise, the voltage of the first node N1 is higher than that of the second node N2. If the voltage difference ΔV is greater than a sense margin ΔVth of the sense amplifier 24, after the sense amplifier 24 is turned on, a conduction degree of the seventh transistor M7 is greater than that of the sixth transistor M6, and the second node N2 is first pulled to the second voltage $V_{ss}$ through the seventh transistor M7 with a greater conduction degree, causing the eighth transistor M8 to be turned on and the sixth transistor M6 to be turned off; and the voltage of the first node N1 rapidly rises to the first voltage Vary, the ninth transistor M9 is turned off, the seventh transistor M7 is turned on, and the voltage of the second node N2 is fixed to the second voltage $V_{SS}$. At this point, when the voltage of the bit line BL is read by means of the Y Select signal YS, the first voltage Vary can be read. That is, the read result is "1".

Figure 4A:
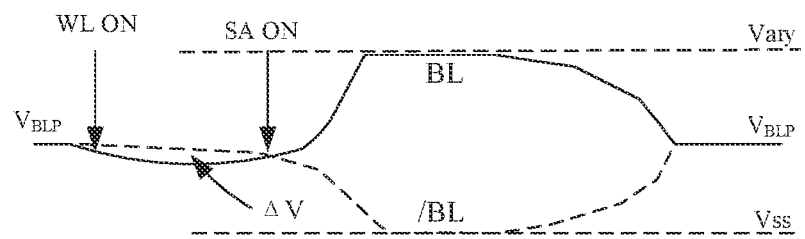
FIG. 4A is a schematic diagram of failure to read data "0" in a scenario corresponding to FIG. 3A.

FIG. 4A is a schematic diagram of failure to read data "0" in a scenario corresponding to FIG. 3A.

FIG. 4B is a schematic diagram of failure to read data "1" in a scenario corresponding to FIG. 3B.

Referring to FIG. 4A, if the voltage difference ΔV between the bit line BL and the complementary bit line /BL does not reach the sense margin ΔVth of the sense amplifier 24, when the sense amplifier 24 is turned on (SA ON), the voltage of the first node N1 is not enough to turn on the nine transistors M9 first, but can only control the seventh transistor M7 to discharge slowly, the voltage of the second node N2 drops slowly, the conduction degree of the eighth transistor M8 increases slowly, and the voltage of the first node N1 rises. Finally, the voltage of the second node N2 drops to control the eighth transistor M8 to be turned on, causing the voltage of the first node N1 to rise to the first voltage Vary, thereby causing the ninth transistor M9 to be turned off and the seventh transistor M7 to be turned on, where the voltage of the second node N2 is equal to the second voltage $V_{SS}$. At this moment, the voltage on the bit line BL is the first voltage Vary, i.e., the data "1", and reading of the data "0" fails.

Referring to FIG. 4B, if the voltage difference ΔV between the bit line BL and the complementary bit line /BL does not reach the sense margin ΔVth of the sense amplifier 24, when the sense amplifier 24 is turned on (SA ON), the voltage of the first node N1 is not enough to turn on the seventh transistor M7 first. In this case, the sixth transistor M6 and the seventh transistor M7 leak electricity almost simultaneously, and the voltage of the first node N1 and the voltage of the second node N2 drop simultaneously. Because the voltage of the memory capacitor C is lower at this moment, and the bit line BL needs to share charges with the memory capacitor C, causing the voltage of the bit line BL to drop faster until the ninth transistor M9 is turned on, such that the voltage of the second node N2 is quickly pulled to the first voltage Vary, causing the eighth transistor M8 to be turned off and the sixth transistor M6 to be turned on, and the voltage of the first node N1 is fixed to the second voltage $V_{SS}$. At this moment, the voltage on the bit line BL is the second voltage $V_{SS}$, i.e., the data "0", and reading of the data "1" fails.

The data writing process is basically similar to the data reading process.

When performing the data writing process, after the activation signal ACT arrives, the voltage of equalizer VEQ is turned off (VEQ OFF), the word line WL is turned on (WL ON), and the charge sharing stage between the bit line BL and the memory capacitor C is entered. As the sense amplifier 24 is turned on (SA ON), the sense amplifier 24 amplifies the voltage variation on the bit line BL, that is, the sense amplification stage is entered. After the sense amplification stage is ended, the voltage on the bit line BL is stable, and the data restore stage is entered. At this moment, in response to a write control signal WR, a column select pulse appears on the Y Select signal line YS (YS ON), and data on the local input/output signal line LIO is transmitted to the bit line BL, causing the voltage variation on the bit line BL. The voltage variation is amplified by the sense amplifier 24, and the bit line BL and the complementary bit line /BL are respectively pulled to new potentials, such that the bit line BL can share the charges with the memory capacitor C, and the data of the memory capacitor C is reset, which is the data writing process. The data writing process is ended when the precharge signal PRE arrives. After that, the voltage of equalizer VEQ is turned on (VEQ OFF), the word line WL is turned off (WL OFF), and the bit line BL and the complementary bit line /BL are restored to $V_{BLP}$ until a next activation signal ACT arrives.

During this period, the time from the write control signal WR to the precharge signal PRE is the write time tWR. As can be known from ending the charge sharing between the bit line BL and the memory capacitor C by the precharge signal PRE, the write time tWR affects state of charges in the memory capacitor C. If the write time tWR is shorter, it is prone to insufficient data writing of the memory capacitor C. that is, the charges in the memory capacitor C are insufficient when the process of writing the data "1" is ended, or residual charges in the memory capacitor C are more when the process of writing the data "0" is ended.

Next, a method for detecting the sense margin ΔVth of the sense amplifier 24 according to an embodiment of the present disclosure is introduced.

FIG. 5 is a flowchart of a method for sense margin detection for a sense amplifier in an embodiment of the present disclosure.

Referring to FIG. 5, a method 500 may include:

Step S1: writing first data and second data respectively to a first memory cell and a second memory cell connected to a first bit line, where the first memory cell and the second memory cell are respectively connected to a first word line and a second word line adjacent to each other, and the first bit line is connected to a first sense amplifier;

Step S2: performing a reverse write operation on the first memory cell and the second memory cell, where the reverse write operation includes reversely writing the second data to the first memory cell and reversely writing the first data to the second memory cell;

Step S3: performing write operations on memory cells connected to the second bit line, the first word line and the second word line, where there is preset row precharge time between adjacent two of the write operations, the second bit line is connected to a second sense amplifier, and both the second sense amplifier and the first sense amplifier are positioned in the same sense amplifier array; and Step S4: reading the second memory cell, and determining the preset row precharge time to be a margin value of row precharge time of the first sense amplifier when the first data is not correctly read.

In the embodiment as shown in FIG. 5, when the first data is 1 and the second data is 0, the sense margin (i.e., the margin value of row precharge time) of the sense amplifier for the data 1 may be detected; and when the first data is 0 and the second data is 1, the sense margin (i.e., the margin value of row precharge time) of the sense amplifier for the data 0 may be detected. For the convenience of description, the first data is replaced with A, and the second data is replaced with B.

Each of the steps of the method 500 will be described in detail below.

In Step S1, the first data and the second data are respectively written to the first memory cell and the second memory cell connected to the first bit line, where the first memory cell and the second memory cell are respectively connected to the first word line and the second word line adjacent to each other, a sequence number of the first bit line is smaller than that of the second word line, and the first bit line is connected to the first sense amplifier.

In the memory array 100 as shown in FIG. 1, each of the sense amplifiers may be used as the first sense amplifier, and correspondingly, the bit lines BL connected to the sense amplifier may be used as first bit line, and memory cells of the first bit line connected to adjacent word lines may be used as the first memory cell and the second memory cell. That is, there may be a plurality of first bit lines, and number of the first memory cells and number of the second memory cells connected to each of the plurality of first bit lines may be the same or may be different.

The first memory cells and the second memory cells include all memory cells connected to the bit lines corresponding to all the sense amplifiers to be tested, where each of the sense amplifiers to be tested is the first sense amplifier, and the bit lines corresponding to the sense amplifiers to be tested are the first bit lines.

Figure 6A:
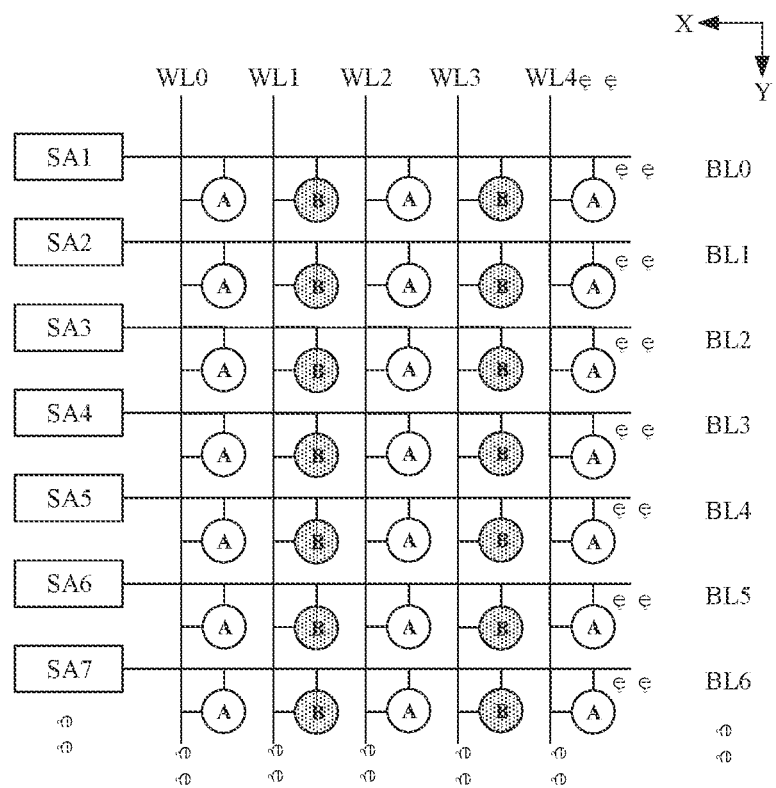
FIGS. 6A to 6C are schematic diagrams showing arrangement of a first memory cell and a second memory cell.
Figure 6B:
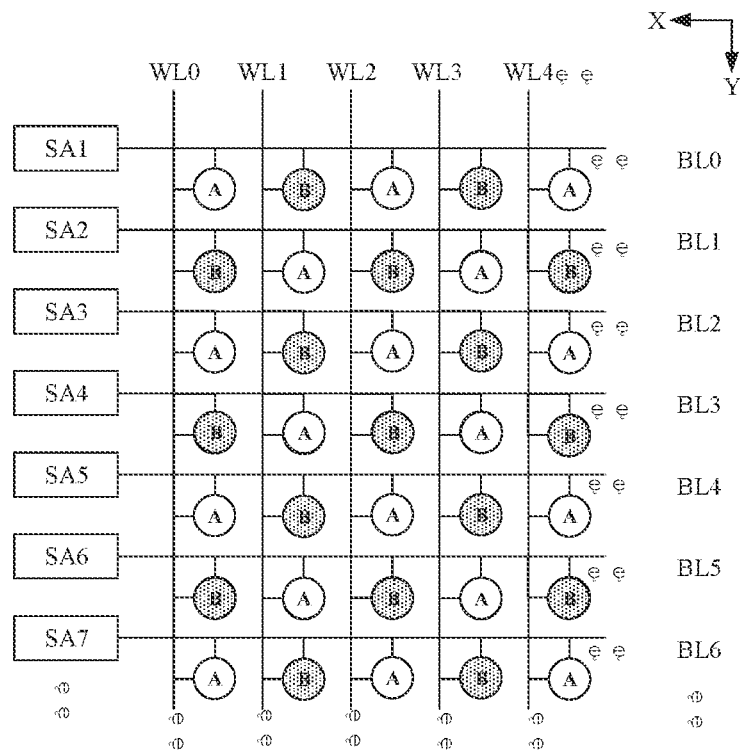
Figure 6C:
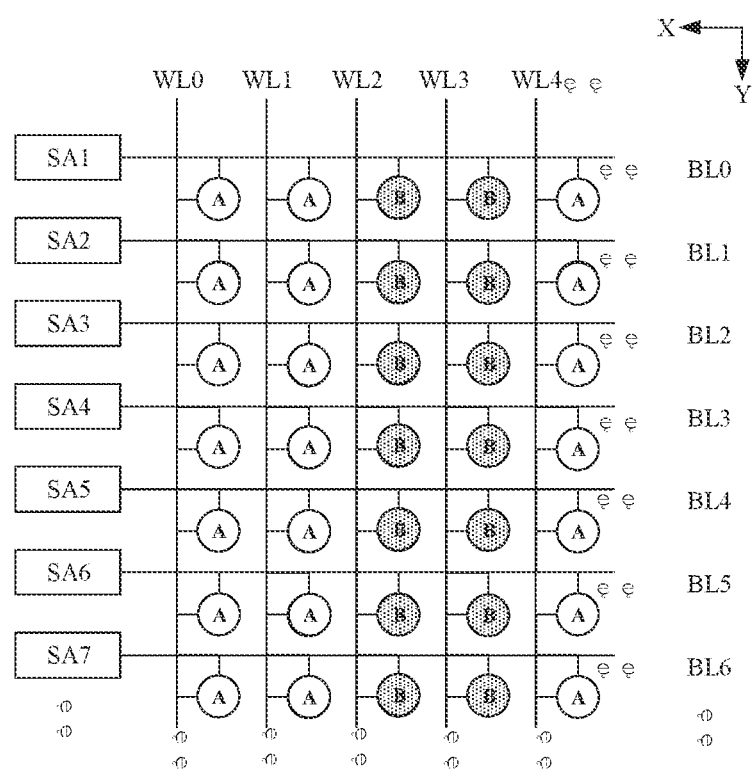

FIGS. 6A to 6C are schematic diagrams showing arrangement of the first memory cells and the second memory cells.

Referring to FIG. 6A and FIG. 6B, in one embodiment, the first memory cells to which the first data A is written and the second memory cells to which the second data B is written may be arranged at intervals on the first bit line. That is, the memory cells adjacent to the first memory cells on the same first bit line are second memory cells, and the memory cells adjacent to the second memory cells on the same first bit line are first memory cells.

Referring to FIG. 6C, in another embodiment, a plurality of first memory cells and a plurality of second memory cells may be arranged adjacent to each other. That is, on the same first bit line, one or more first memory cells are adjacent to each other, and one or more second memory cells are adjacent to each other, and at least one of the plurality of second memory cells is adjacent to the first memory cells.

The first word lines and the second word lines do not refer to fixed word lines but are adjacent word lines that respectively connect the first memory cells and the second memory cells. In one embodiment, the memory cells connected to the first word lines are all first memory cells, and the memory cells connected to the second word lines are all second memory cells. The first word lines are, for example, even-numbered word lines (WL0, 2, 4, . . . ), and the second word lines are, for example, odd-numbered word lines (WL1, 3, 5, . . . ), as shown in FIG. 6A. In another embodiment, the memory cells connected to one word line may have both the first memory cells and the second memory cells (as shown in FIG. 6B).

In addition to test topo showing arrangement of the first memory cells and the second memory cells as shown in FIGS. 6A to 6C, there may be other test topos, which is not particularly limited in the present disclosure.

When there are a plurality of first bit lines, the process of respectively writing the first data and the second data to the first memory cells and the second memory cells in Step S1 may employ a Y-Page writing method. In the Y-Page writing method, one word line is enabled to write data to all the memory cells connected to this word line. After data writing is completed for all the memory cells connected to this word line, this word line is disabled, and a next word line is enabled.

In Step S2, a reverse write operation is performed on the first memory cells and the second memory cells, where the reverse write operation includes reversely writing the second data to the first memory cells and reversely writing the first data to the second memory cells.

In this step, the reverse write operation is performed on all the first memory cells and the second memory cells mentioned before, regardless of whether number of the first bit lines is one or more and the number of the first memory cells and the number of the second memory cells are one or more.

It should be emphasized that when there are a plurality of first bit lines, or even the entire memory array is tested, it is required to perform the reverse write operation on the plurality of first bit lines in groups, to use the subsequent first bit lines as the second bit lines for operation (a principle is seen in subsequent description for details).

In one embodiment, the reverse write operation may be performed on the first memory cells and the second memory cells connected to a plurality of groups of first bit lines in a first order, where each of the plurality of groups of first bit lines includes a first number of first bit lines adjacent to each other, and the first order is determined according to sequence numbers of bit lines in the plurality of groups of first bit lines from small to large. For example, the first number is equal to a burst length of a memory array to be tested, where the memory array to be tested is a memory array where the first memory cells and the second memory cells are positioned.

Figure 7A:
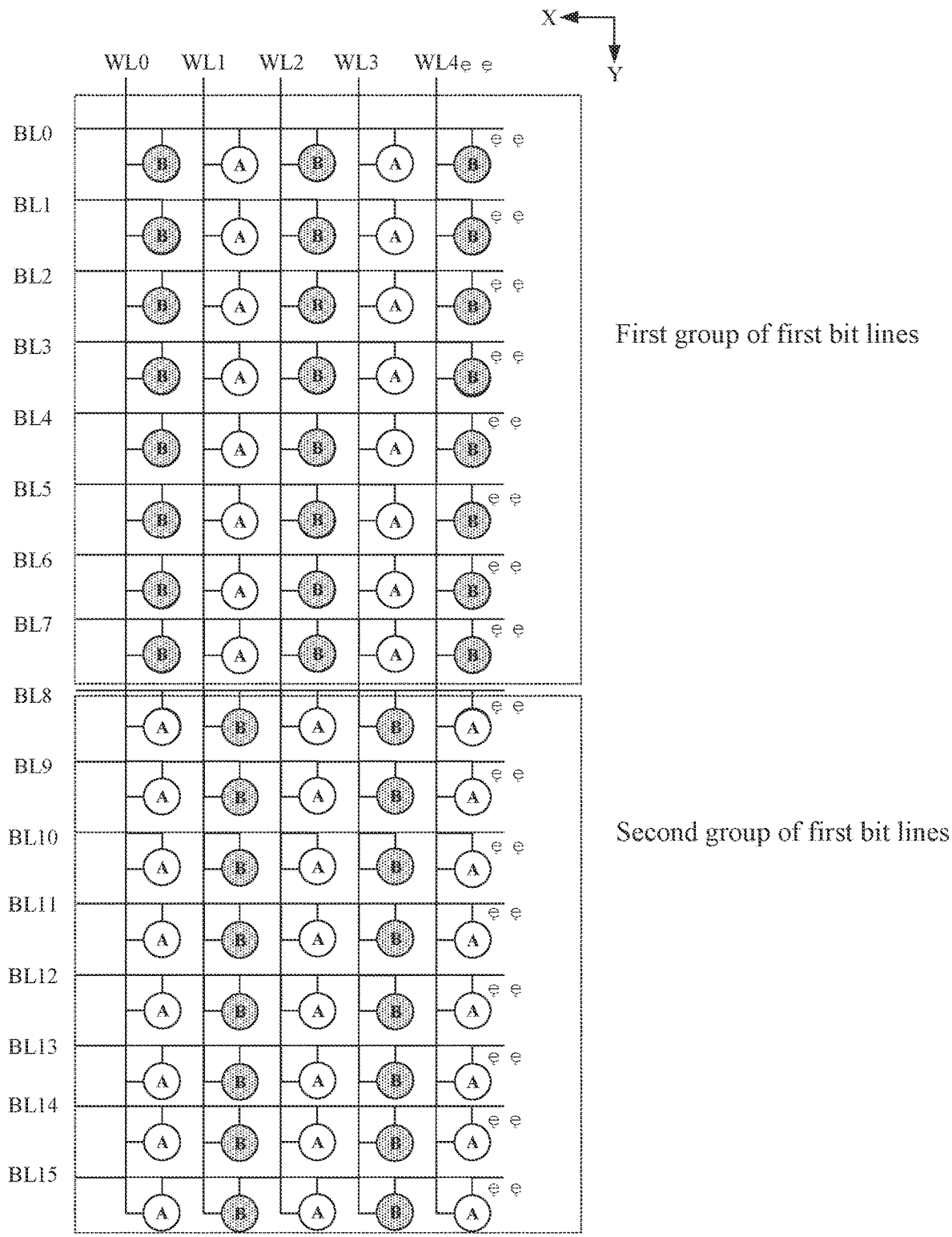
FIG. 7A and FIG. 7B are schematic diagrams of performing reverse write operations on the first memory cell and the second memory cell connected to a plurality of first bit lines.
Figure 7B:
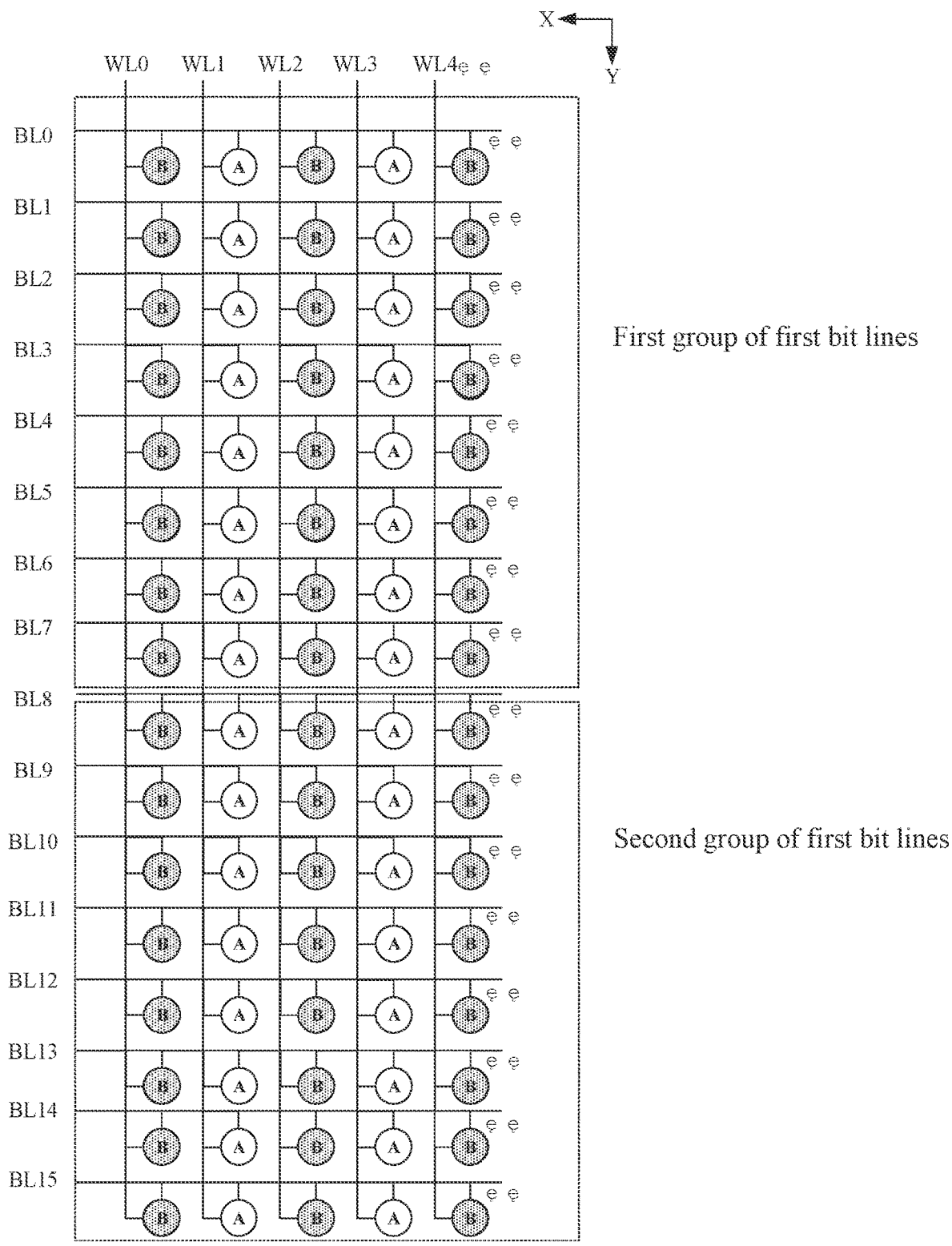

FIG. 7A and FIG. 7B are schematic diagrams of performing the reverse write operation on the first memory cells and the second memory cells connected to a plurality of first bit lines.

Referring to FIG. 7A and FIG. 7B, taking an example where the first memory cells and the second memory cells on the first bit line are arranged at intervals one by one, assuming that the burst length of the memory array to be tested is 8, the first group of first bit lines are BL0~BL7, the second group of first bit lines are BL8~BL15, and so on. First, the reverse write operation is performed on the first memory cells and the second memory cells connected to the first group of first bit lines BL0~BL7 (as shown in FIG. 7A), and then the reverse write operation is performed on the first memory cells and the second memory cells connected to the second group of first bit lines BL8~BL15 (as shown in FIG. 7B), and so on, which is not to be shown subsequently. That is, the reverse write operation is performed on the first memory cells and the second memory cells by means of an X-Fast writing method. In the X-Fast writing method, when performing a write operation, one word line is enabled to sequentially write data of one-Burst-length memory cells on this word line (also referred to as writing one-Burst data), and then this word line is disabled. Next, a next word line is enabled to sequentially write data of one-Burst-length memory cells on this word line, until all word lines are enabled to sequentially write data of the memory cells connected to all the word lines on the same bit line.

In one embodiment, in the reverse write operation, write time tWR of the first data is controlled to be preset write delay, such that insufficient write of the first data occurs in the second memory cells.

Figure 8:
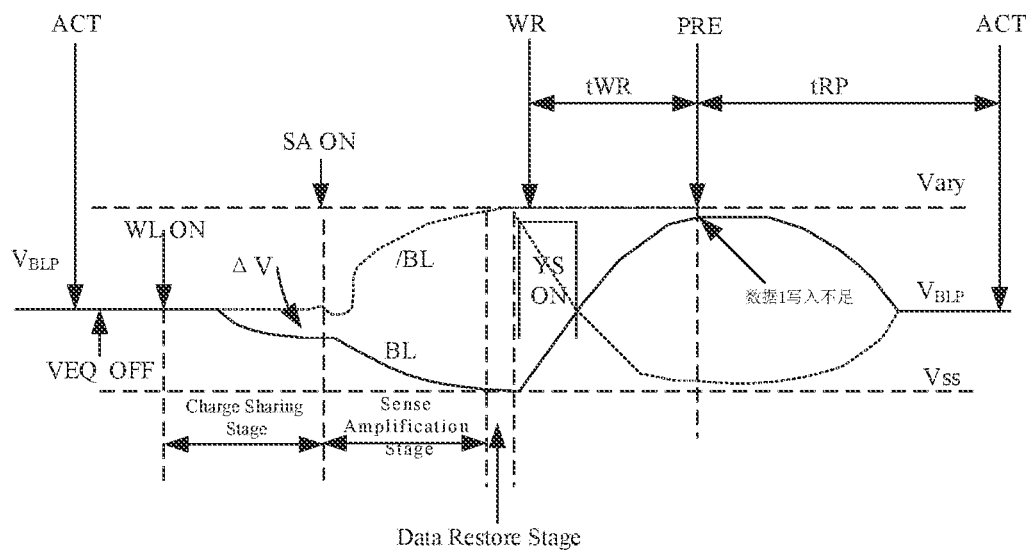
FIG. 8 is a schematic diagram of a reverse write operation in an embodiment of the present disclosure.

FIG. 8 is a schematic diagram of a reverse write operation in an embodiment of the present disclosure.

Referring to FIG. 8, when the first data is 1 and the second data is 0, the second memory cell stores the data "0" before the reverse write operation and stores the data "1" after the reverse write operation. With reference to the circuit as shown in FIG. 2, the reverse write operation to the second memory cell may be described as below.

After the activation signal ACT arrives, the voltage of equalizer VEQ is turned on (VEQ ON), the word line WL is turned on (WL ON), and the bit line BL connected to the second memory cell (the memory cell 21 in FIG. 2) and the second memory cell enter the charge sharing stage, such that the voltage on the bit line BL drops. After the sense amplifier 24 is turned on, the sense amplification stage is entered, such that the bit line BL is pulled to the second voltage $V_{SS}$, and the complementary bit line /BL is pulled to the first voltage Vary. After the voltage of the bit line BL is stable, the data restore stage is entered. After the write control signal WR arrives, the column select pulse appears on the Y Select signal line YS (YS ON), and the first data "1" on the local input/output signal line LIO is transmitted to the bit line BL, causing the voltage of the bit line BL to be pulled high, and simultaneously the bit line BL discharges electricity to the memory capacitor C, thereby increasing the voltage of the memory capacitor C, causing the voltage of the bit line BL to rise slowly to the first voltage Vary corresponding to the first data "1". If the write time tWR of the first data "1" is insufficient, that is, if the precharge signal PRE arrives earlier, this may cause a consequence that the bit line BL has not yet fully risen to the first voltage Vary, and the charges of the memory capacitor C are insufficient, i.e., insufficient write of the first data "1".

Similarly, when the first data is 0 and the second data is 1, if the precharge signal PRE arrives earlier, there is still residual charges in the memory capacitor C, i.e., insufficient write of the first data "1".

Insufficient write of the first data may increase probability of subsequent sense failure, as detailed below.

In Step S3, write operations are performed on memory cells connected to the second bit line, the first word line and the second word line, where there is preset row precharge time between adjacent two of the write operations, the second bit line is connected to a second sense amplifier, and both the second sense amplifier and the first sense amplifier are positioned in the same sense amplifier array.

The memory cells connected to the second bit line, the first word line and the second word line are memory cells connected to the same word line as the first memory cells and the second memory cells connected to the first bit line. Because the second sense amplifier and the first sense amplifier are positioned in the same sense amplifier array, when the memory cells connected to the second bit line are operated, the first sense amplifier may also enter a synchronous working state (that is, there also exist the charge sharing stage, the sense amplification stage, and the data restore stage). However, no data exchange is carried out with the local input/output signal line LIO.

Figure 9A:
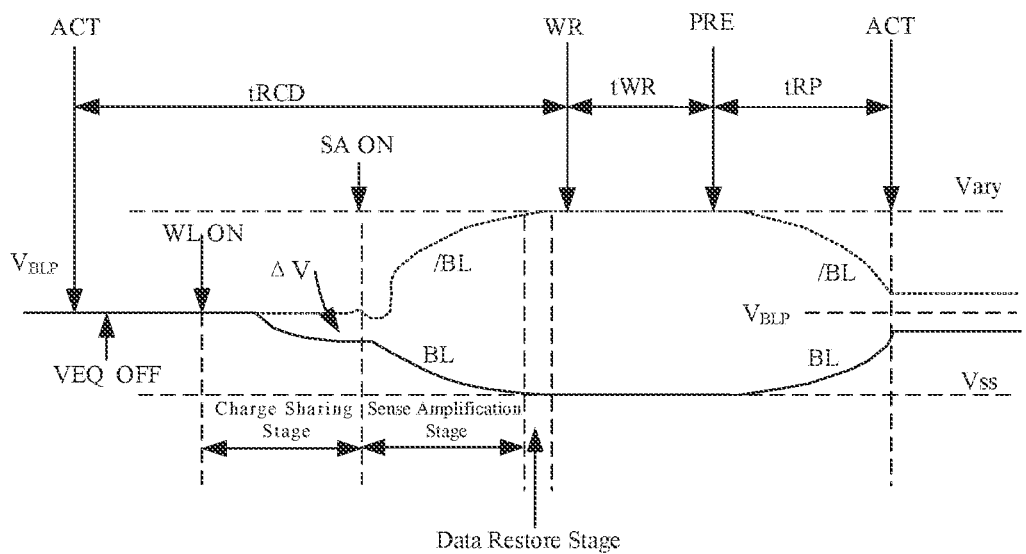
FIG. 9A and FIG. 9B respectively are schematic diagrams showing states of the first memory cell and the second memory cell connected to the first bit line in Step S3.
Figure 9B:
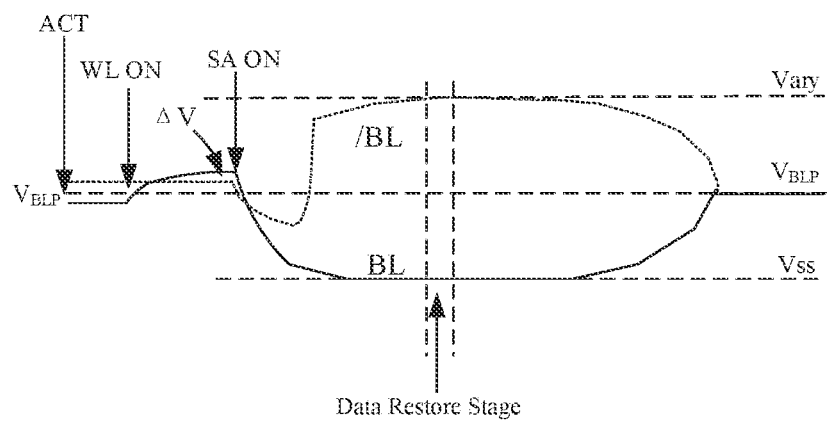

FIG. 9A and FIG. 9B respectively are schematic diagrams showing states of the first memory cell and the second memory cell connected to the first bit line in Step S3. FIG. 9A is a schematic diagram showing states of the first memory cells, and FIG. 9B is a schematic diagram showing states of the second memory cells.

Referring to FIG. 9A and FIG. 9B, supposing that the first memory cells connected to the first bit line are connected to the first word line, and the first data is 1 and the second data is 0, after the reverse write operation is performed, the first memory cells store the second data 0, and the second memory cell store the first data 1.

When a write operation is performed on the memory cells connected to the second bit line and the first word line, the first sense amplifier connected to the first bit line enters the synchronous working state. Because the first memory cells and the second memory cells are respectively connected to the first word line and the second word line, when the first word line and the second word line are enabled in the write operation, the first memory cells and the second memory cells may exchange data with the first bit line.

In FIG. 9A, after the reverse write operation is performed, the second data 0 is stored in the first memory cells. When the write operation is performed on the memory cells connected to the second bit line, before the precharge signal PRE arrives, because the first bit line BL does not need to exchange data with the local input/output signal line LIO, the voltage of the first bit line BL is always equal to the second voltage $V_{SS}$, and is maintained in the data restore stage. After the precharge signal PRE arrives, the voltage of the first bit line BL begins to rise. Before a next activation signal ACT arrives, sense of the first bit line BL to a next memory cell will not be affected if the voltage of the first bit line BL can drop to $V_{BLP}$. If the preset row precharge time tRP is shorter, that is, if the next activation signal ACT arrives earlier, the voltage of the first bit line BL will be lower than $V_{BLP}$.

In FIG. 9B, when the first bit line BL is continuously employed to operate the second memory cell, because the second memory cell stores the first data 1, in the charge sharing stage, the voltage of the first bit line BL will rise. However, because an initial voltage of the first bit line BL is lower than $V_{BLP}$, and the voltage of the first bit line BL is still lower after rising, which is not enough to turn on the seventh transistor M7 first in the circuit as shown in FIG. 2, causing the first bit line BL to be pulled to the second voltage $V_{ss}$ (referring to FIG. 4A, FIG. 4B and corresponding description for details). Because the first bit line BL no longer exchanges data with the local I/O signal line LIO, in the data restore stage, the data in the second memory cells will be reset to 0 by the first bit line BL. That is, the first data is changed.

If there are residual charges due to insufficient write of the first data 0 in the second memory cells, the voltage drop of the first bit line BL may be smaller, which further increases the possibility of overwriting the first data in the second memory cells.

The same is true when the first data is 1 and the second data is 0, and details are not repeated here.

Therefore, by shortening the preset row precharge time tRP, the sense margin of the sense amplifier can be reduced, and the probability of sense failure of the sense amplifier can be increased, such that a minimum row precharge time tRP that allows successful sense of the sense amplifier can be detected, where the minimum row precharge time tRP is the margin value of row precharge time.

By shortening the write time tWR required for writing the first data into the second memory cells, insufficient write is produced in the second memory cells, the probability of sense failure of the sense amplifier can be further increased, such that occurrence of sense failure of the sense margin can be detected for the sense amplifier as soon as possible.

According to the above principle, when the write time tWR is set longer, the margin value of row precharge time is smaller (that is, the tRP is shorter); when the write time tWR is set shorter, the margin value of row precharge time is greater (that is, the tRP is longer); and when the write time tWR is set very short, no matter how the row precharge time is adjusted, successful sense to the second memory cells cannot be achieved (that is, data of the second memory cells is overwritten), where the write time may be set as a margin value of the write time. Therefore, in some embodiments, the margin value of row precharge time corresponding to each write time tWR may be measured.

In addition, the minimum write time tWR (that is, the margin value of the write time) causing the sense failure under each preset row precharge time tRP may also be measured. Of course, when the tRP is set very short, no matter how long the row precharge time is set, successful sense to the second memory cells cannot be achieved, and the tRP in this case also belongs to the margin value of row precharge time.

By measuring a plurality of groups of combinations of margin values that just cause the sense failure (tWR, tRP), an effective data basis can be provided for analysis and design of the sense amplifier.

As can be seen from the above embodiments, when a write operation is performed on a memory cell connected to the second bit line, the written data is not important. What is important is that the memory cell into which the data is written needs to be connected to the same word line as the first memory cell and the second memory cell, such that when this memory cell is operated, the first memory cell and the second memory cell are controlled to exchange data with the first bit line, and the data restore stage is entered, such that the data in the second memory cell is overwritten in the event of the sense failure.

In one embodiment, when there are a plurality of first bit lines, some of the plurality of first bit lines having not been operated may be used as the second bit lines. For example, when testing the sense amplifier connected to the entire memory array and performing the reverse write operation on the first memory cells and the second memory cells connected to a plurality of groups of first bit lines in groups, the first group of first memory cells having not been operated may be considered as the second bit lines. Subsequently, because the second bit line is one of the plurality of first bit lines, the reverse write operation may be performed on the first memory cell and the second memory cell connected to this second bit line.

As can be seen from the above description, assuming that there are x groups of first bit lines (x>2), after the reverse write operation is performed on the entire memory array in sequence, the second memory cells connected to the first group of first bit lines enter the data restore stage not carrying out data exchange with the LIO for (x−1) times, the second memory cells connected to the second group of first bit lines enter the data restore stage not carrying out data exchange with the LIO for (x−2) times. By analogy, the second memory cells connected to the (x−1)$^{th}$ group of first bit lines enter the data restore stage not carrying out data exchange with the LIO for one time, and the second memory cells connected to the x$^{th}$ group of first bit lines do not enter the data restore stage not carrying out data exchange with the LIO.

The greater the number of data restore stages not carrying out data exchange with LIO is, the higher the probability of occurrence of the sense failure and data of the second memory cell to be overwritten is, and the more accurate the test is. Therefore, to balance a test accuracy for the second memory cells connected to the first bit lines, before reading the second memory cells, the reverse write operation may also be performed on the first memory cells and the second memory cells connected to the plurality of groups of first bit lines in a second order, where the second order is opposite to the first order. Thus, the second memory cells connected to each of the plurality of groups of first bit lines enter the data restore stage not carrying out data exchange with the LIO for (x−1) times.

In one embodiment of the present disclosure, the first sense amplifier connected to the first bit line may be provided to connect a test voltage. When the first data is 1, a power supply voltage of the test voltage is lower than a power supply voltage when the memory array to be tested is working properly; and when the first data is 0, a grounding voltage of the test voltage is higher than a grounding voltage of the memory array to be tested. In this way, insufficient write of the first data is further produced in the second memory cells, and a speed of reaching the sense margin of the first sense amplifier is accelerated. Corresponding to the above, a combination of margin values (tRP, tWR) causing the sense failure corresponding to each group of test voltages may also be measured, to provide a data basis for analysis and design of the sense amplifier.

In Step S4, the second memory cell is read, and the preset row precharge time is determined to be a margin value of row precharge time of the first sense amplifier when the first data is not correctly read.

The Y-Page reading method may be employed when reading the second memory cell. That is, one word line is enabled, after reading all the memory cells connected to this word line, this word line is disabled, and then a next word line is enabled.

When testing the entire memory array, each of the word lines may be enabled in sequence to read each of the memory cells, and only the data of the second memory cells is determined. In some embodiments, also only the word lines connected to the second memory cells may be enabled.

After the above steps are completed, if the sense amplifier fails to sense, the first data in the second memory cells may be overwritten, such that the first data cannot be correctly read from the second memory cells.

In addition, when the first data is correctly read from each of the second memory cells, the preset row precharge time tRP is reduced, and a detection is made again according to the above Steps S1-S4. Adjusting the preset row precharge time tRP may be referred to as locking the tRP, and adjusting the write time tWR may be referred to as locking the tWR. By controlling the sense failure of the sense amplifier by means of locking the tRP and locking the tWR, amplification performance of the sense amplifier can be evaluated from multiple angles.

The embodiments of the present disclosure are explained below by taking a test of the entire memory array as an example.

Figure 10:
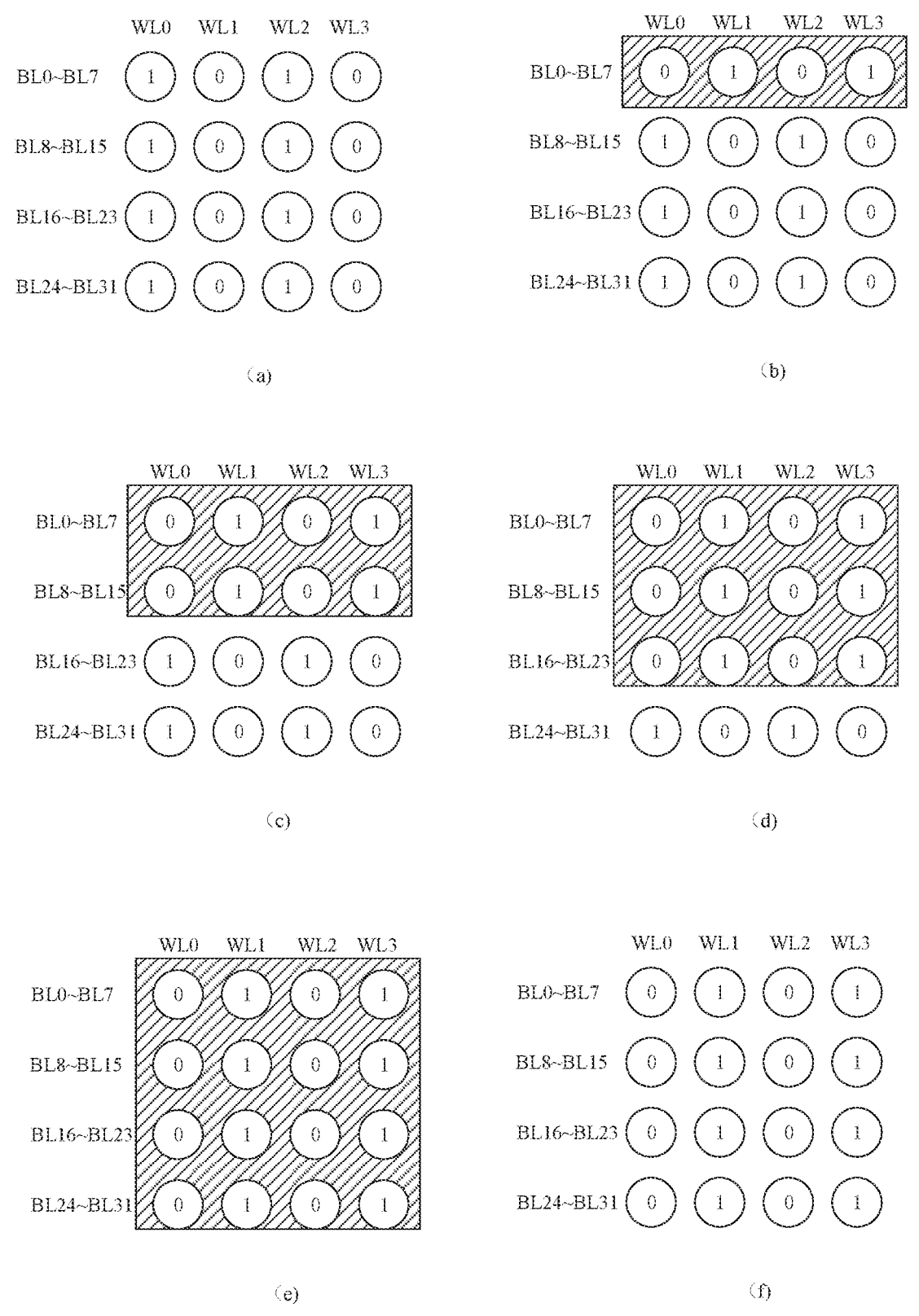

FIG. 10 is a schematic diagram showing a test process for testing the entire memory array according to an embodiment of the present disclosure. In the embodiment as shown in FIG. 10, an example is taken where the first data is 1 and the second data is 0.

Referring to Part (a) of FIG. 10, in Step 1, a first burst of Burst data "1" is written to the memory cells (i.e., the first memory cells) connected to even-numbered word lines WL0, WL2, WL4, WL6 and so on by means of the Y-Page writing method; and a first burst of Burst data "0" is written to the memory cells (i.e., the second memory cells) connected to odd-numbered word lines WL1, WL3, WL5, WL7 and so on by means of the Y-Page writing method.

Referring to Part (b) of FIG. 10, in Step 2, the first burst of Burst data "0" is reversely written to the memory cells (i.e., the first memory cells) connected to the even-numbered word lines WL0, WL2, WL4, WL6 and so on by means of the X-Fast writing method, and the tWR and the tRP are locked; and the first burst of Burst data "1" is written to the memory cells (i.e., the second memory cells) connected to the odd-numbered word lines WL1, WL3, WL5, WL7 and so on by means of the X-Fast writing method, and the tWR and the tRP are locked.

Referring to Part (c) of FIG. 10, in Step 3, a second burst of Burst data "0" is reversely written to the memory cells (i.e., the first memory cells) connected to the even-numbered word lines WL0, WL2, WL4, WL6 and so on by means of the X-Fast writing method, and the tWR and the tRP are locked; and a second burst of Burst data "1" is written to the memory cells (i.e., the second memory cells) connected to the odd-numbered word lines WL1, WL3, WL5, WL7 and so on by means of the X-Fast writing method, and the tWR and the tRP are locked. When each of the word lines WL starts to write the second burst of Burst data, the first burst of Burst data starts to lock the tRP.

Reference is made to FIG. 7A and FIG. 7B for a concrete method of writing the first burst of Burst data and the second burst of Burst data, and the same is true for writing of subsequent Burst data.

Referring to Part (d) of FIG. 10, in Step 4, a third burst of Burst data "0" is reversely written to the memory cells (i.e., the first memory cells) connected to the even-numbered word lines WL0, WL2, WL4, WL6 and so on by means of the X-Fast writing method, and the tWR and the tRP are locked; and a third burst of Burst data "1" is written to the memory cells (i.e., the second memory cells) connected to the odd-numbered word lines WL1, WL3, WL5, WL7 and so on by means of the X-Fast writing method, and the tWR and the tRP are locked. When each of the word lines WL starts to write the third burst of Burst data, the first burst of Burst data and the second burst of Burst data start to lock the tRP.

Referring to Part (e) of FIG. 10, in Step 5, a fourth burst of Burst data "0" is reversely written to the memory cells (i.e., the first memory cells) connected to the even-numbered word lines WL0, WL2, WL4, WL6 and so on by means of the X-Fast writing method, and the tWR and the tRP are locked; and a fourth burst of Burst data "1" is written to the memory cells (i.e., the second memory cells) connected to the odd-numbered word lines WL1, WL3, WL5, WL7 and so on by means of the X-Fast writing method, and the tWR and the tRP are locked. When each of the word lines WL starts to write the third burst of Burst data, the first burst of Burst data, the second burst of Burst data and the third burst of Burst data start to lock the tRP.

Referring to Part (f) in FIG. 10, in Step 6, data of the memory cells (i.e., the second memory cells) connected to the odd-numbered word lines WL1, WL3, WL5, WL7 and so on is read by means of the Y-Page writing method, and it is determined whether the data of all the memory cells is 1. The tRP is shortened and a test is made again if the determination result is YES. Otherwise, it is determined that the current tRP is the margin value of row precharge time.

By applying the detection method provided by the embodiments of the present disclosure to a mass production process, accuracy of detection of the sense margin can be improved for the sense amplifier, which can help to improve product reliability and yield.

In an exemplary embodiment of the present disclosure, there is further provided an electronic device capable of implementing the above method.

As can be appreciated by one skilled in the art, aspects of the present disclosure may be embodied as a system, method or program product. Accordingly, aspects of the present disclosure may take the form of an entirely hardware embodiment, an entirely software embodiment (including firmware, micro-code, etc.) or an embodiment combining software and hardware aspects that may all generally be referred to herein as a "circuit," "circuit" or "system."

The electronic device 1100 according to this embodiment of the present disclosure is described below with reference to FIG. 11. The electronic device 1100 as shown in FIG. 11 is merely an example, and no limitation should be imposed on functions or scope of use of the embodiment of the present disclosure.

Figure 11:
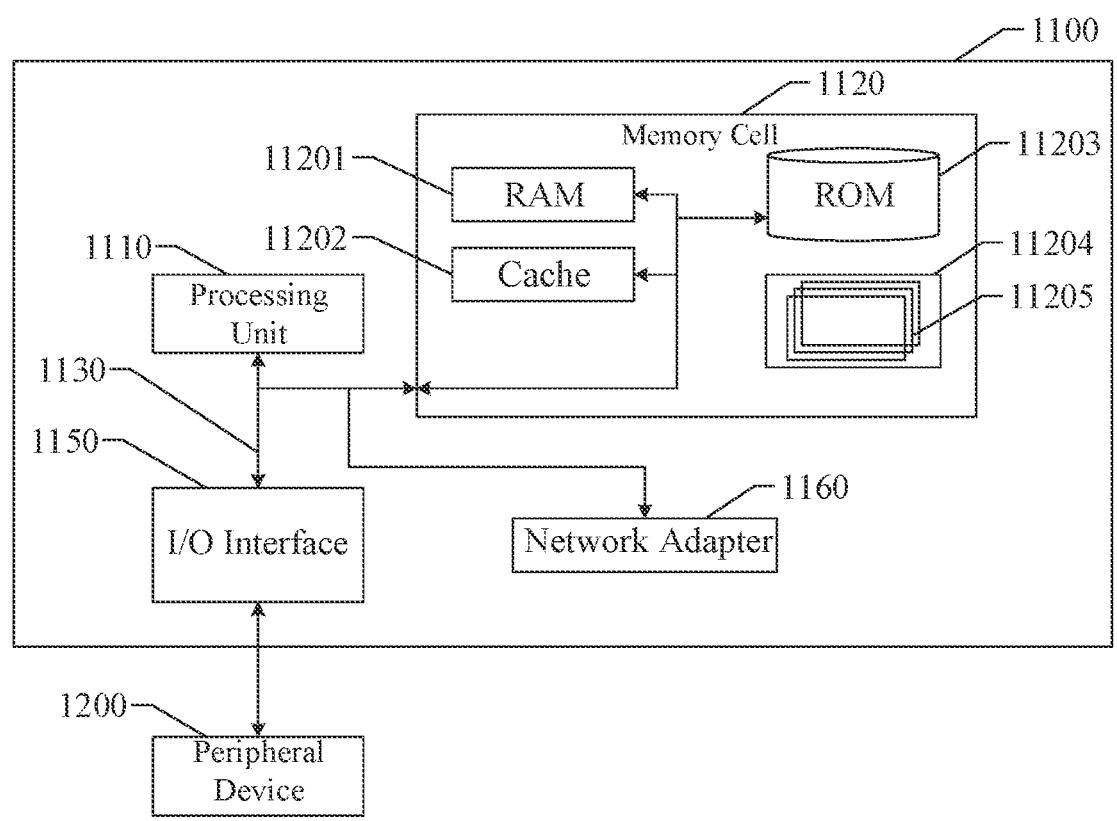
FIG. 11 is a block diagram of an electronic device in an exemplary embodiment of the present disclosure.

As shown in FIG. 11, the electronic device 1100 is shown in the form of a general-purpose computing device. Components of the electronic device 1100 may include, but are not limited to: at least one processing unit 1110, at least one memory cell 1120, and a bus 1130 connecting different system components (including the memory cell 1120 and the processing unit 1110).

The memory cell stores a program code, which may be executed by the processing unit 1110, such that the processing unit 1110 performs steps described in the "exemplary method" portions of the specification according to exemplary embodiments of the present disclosure. For example, the processing unit 1110 may perform the methods shown in the embodiments of the present disclosure.

The memory cell 1120 may include readable media in the form of volatile memory cell, such as a random access memory (RAM) 11201 and/or a cache memory 11202. Furthermore, the memory cell 1120 may further include a read-only memory (ROM) 11203.

The memory cell 1120 may include a program/utility tool 11204 having a group of (at least one) program circuits 11205. The program circuits 11205 include, but are not limited to: an operating system, one or more applications, other program circuits and program data. Each or a certain combination of these examples may include implementation of network environment.

The bus 1130 may represent one or more of a plurality of bus structures, including a memory bus or memory controller, a peripheral bus, an accelerated graphics port, a processing unit or a local bus using any bus structure among the plurality of bus structures.

The electronic device 1100 may communicate with one or more peripheral devices 1200 (such as keyboards, pointing devices, Bluetooth devices, etc.), and also may communicate with one or more devices allowing a user to interact with the electronic device 1100, and/or may communicate with any device (for example, a router, a modem and so on) allowing the electronic device 1100 to communicate with one or more other computing devices. This communication may be implemented by means of an input/output (I/O) interface 1150. Moreover, the electronic device 1100 also may communicate with one or more networks (for example, a local area network (LAN), a wide area network (WAN) and/or a public network such as the Internet) via a network adapter 1160. As shown in FIG. 6, the network adapter 1160 communicates with other circuits of the electronic device 1100 through the bus 1130. It should be understood that although not shown in the figures, other hardware and/or software circuits may be used in combination with the electronic device 1100, including but not limited to: microcode, device drivers, redundancy processing units, external disk drive arrays, redundant arrays of independent disks (RAID) systems, tape drives and data backup and storage systems, etc.

In an exemplary embodiment of the present disclosure, there is further provided a computer-readable storage medium storing a program product capable of implementing the above method in this specification. In some possible embodiments, aspects of the present disclosure may be implemented as a form of a program product, which includes a program code. When the program product runs on a terminal device, the program code is configured to enable the terminal device to perform the steps described in the above "exemplary method" portions of this specification according to the exemplary embodiments of the present disclosure.

Moreover, the above accompanying drawings are merely illustrative description of processes included in the method according to the exemplary embodiments of the present disclosure and are not intended to limit the present disclosure. It is easy to understand that the processes shown in the above accompanying drawings do not indicate or limit time sequences of these processes. Furthermore, it is also easy to understand that these processes may be executed, for example, synchronously or asynchronously in a plurality of circuits.

Other embodiments of the present disclosure will be apparent to those skilled in the art from consideration of the specification and practice of the invention disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the claims.

What is claimed is:

1. A method for sense margin detection for a sense amplifier, comprising:
   writing first data and second data respectively to a first memory cell and a second memory cell connected to a first bit line, the first memory cell and the second memory cell being respectively connected to a first word line and a second word line adjacent to each other, and the first bit line being connected to a first sense amplifier;
   performing a reverse write operation on the first memory cell and the second memory cell, the reverse write operation comprising reversely writing the second data to the first memory cell and reversely writing the first data to the second memory cell;
   performing write operations on memory cells connected to the second bit line, the first word line and the second word line, there being preset row precharge time between adjacent two of the write operations, the second bit line being connected to a second sense amplifier, both the second sense amplifier and the first sense amplifier being positioned in a same sense amplifier array; and
   reading the second memory cell, and determining the preset row precharge time to be a margin value of row precharge time of the first sense amplifier when the first data is not correctly read.

2. The detection method according to claim 1, wherein there are a plurality of the first bit lines, the second bit line being a first bit line next to the first bit line in a current operation, and the performing a reverse write operation on the first memory cell and the second memory cell comprises:
   performing the reverse write operation on the first memory cell and the second memory cell connected to a plurality of groups of first bit lines in a first order, each of the plurality of groups of first bit lines comprising a first number of first bit lines adjacent to each other, the first order being determined according to sequence numbers of bit lines in the plurality of groups of first bit lines from small to large; and
   the performing write operations on memory cells connected to the second bit line, the first word line and the second word line comprises:
   performing the reverse write operation on the first memory cell and the second memory cell connected to the second bit line, the second bit line being one of the plurality of first bit lines.

3. The detection method according to claim 2, wherein before reading the second memory cell, the detection method further comprises:
   performing the reverse write operation on the first memory cell and the second memory cell connected to the plurality of groups of first bit lines in a second order, the second order being opposite to the first order.

4. The detection method according to claim 2, wherein the first number is equal to a burst length of a memory array to be tested, the memory array to be tested being a memory array where the first memory cell and the second memory cell are positioned.

5. The detection method according to claim 1, further comprising:
reducing the preset row precharge time for detection again when the first data is correctly read from each of the second memory cells.

6. The detection method according to claim 1, wherein in the reverse write operation, write time of the first data is controlled to be preset write delay, such that insufficient write of the first data occurs in the second memory cell.

7. The detection method according to claim 1, wherein the first data is 1 and the second data is 0; or the first data is 0 and the second data is 1.

8. The detection method according to claim 1, wherein the first memory cell and the second memory cell comprise all memory cells connected to bit lines corresponding to all sense amplifiers to be tested.

9. The detection method according to claim 1, wherein each of the memory cells adjacent to the first memory cell on the same first bit line is the second memory cell.

10. The detection method according to claim 9, wherein the first memory cell and the second memory cell are arranged on the same word line.

11. The detection method according to claim 1, wherein on the same first bit line, one or more of the first memory cells are adjacent to each other, one or more of the second memory cells are adjacent to each other, and at least one of the second memory cells is adjacent to the first memory cells.

12. The detection method according to claim 1, wherein the first sense amplifier is connected to a test voltage.

13. The detection method according to claim 12, wherein when the first data is 1, a power supply voltage of the test voltage is lower than a power supply voltage when the memory array to be tested is working properly; and when the first data is 0, a grounding voltage of the test voltage is higher than a grounding voltage of the memory array to be tested.

14. An electronic device, comprising:
a memory; and
a processor coupled to the memory, the processor being configured to perform a method for sense margin detection for a sense amplifier based on instructions stored in the memory, wherein the method comprises:
writing first data and second data respectively to a first memory cell and a second memory cell connected to a first bit line, the first memory cell and the second memory cell being respectively connected to a first word line and a second word line adjacent to each other, and the first bit line being connected to a first sense amplifier;
performing a reverse write operation on the first memory cell and the second memory cell, the reverse write operation comprising reversely writing the second data to the first memory cell and reversely writing the first data to the second memory cell;
performing write operations on memory cells connected to the second bit line, the first word line and the second word line, there being preset row precharge time between adjacent two of the write operations, the second bit line being connected to a second sense amplifier, both the second sense amplifier and the first sense amplifier being positioned in a same sense amplifier array; and
reading the second memory cell, and determining the preset row precharge time to be a margin value of row precharge time of the first sense amplifier when the first data is not correctly read.

15. A non-transitory computer-readable storage medium having a program stored thereon, the program is executable by the processor to implement a method for sense margin detection for a sense amplifier, wherein the method comprises:
writing first data and second data respectively to a first memory cell and a second memory cell connected to a first bit line, the first memory cell and the second memory cell being respectively connected to a first word line and a second word line adjacent to each other, and the first bit line being connected to a first sense amplifier;
performing a reverse write operation on the first memory cell and the second memory cell, the reverse write operation comprising reversely writing the second data to the first memory cell and reversely writing the first data to the second memory cell;
performing write operations on memory cells connected to the second bit line, the first word line and the second word line, there being preset row precharge time between adjacent two of the write operations, the second bit line being connected to a second sense amplifier, both the second sense amplifier and the first sense amplifier being positioned in a same sense amplifier array; and
reading the second memory cell, and determining the preset row precharge time to be a margin value of row precharge time of the first sense amplifier when the first data is not correctly read.

* * * * *